United States Patent
Burton et al.

(10) Patent No.: US 10,008,457 B2
(45) Date of Patent: Jun. 26, 2018

(54) RESONANCE-COUPLED SIGNALING BETWEEN IC MODULES

(71) Applicant: SEMICONDUCTOR COMPONENTS INDUSTRIES, LLC, Phoenix, AZ (US)

(72) Inventors: Richard Scott Burton, Phoenix, AZ (US); Karel Ptacek, Roznov pod Radhostem (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days. days.

(21) Appl. No.: 15/296,627

(22) Filed: Oct. 18, 2016

(65) Prior Publication Data

US 2018/0108621 A1 Apr. 19, 2018

(51) Int. Cl.
*H04B 3/00* (2006.01)
*H04L 25/00* (2006.01)
(Continued)

(52) U.S. Cl.
CPC ........ *H01L 23/645* (2013.01); *H01L 23/5227* (2013.01); *H01L 23/66* (2013.01);
(Continued)

(58) Field of Classification Search
USPC ........................................ 375/257, 219, 528
See application file for complete search history.

(56) References Cited

U.S. PATENT DOCUMENTS

| 4,087,701 | A | * | 5/1978 | Anderson | ................. H04B 3/56 307/149 |
| 5,801,602 | A | * | 9/1998 | Fawal | ................. H01F 17/0006 333/177 |

(Continued)

OTHER PUBLICATIONS

"The Ultimate Flyback: Power Integrations' FluxLink Conversion Technology," EEWeb Electrical Engineering Community Blog, posted Nov. 26, 2014, 5 pages; available at https://www.eeweb.com/blog/eeweb/the-ultimate-flyback-power-integrations-fluxlink-conversion-technology.

(Continued)

*Primary Examiner* — Wednel Cadeau
(74) *Attorney, Agent, or Firm* — Ramey & Schwaller, LLP

(57) ABSTRACT

Coupled resonators for galvanically isolated signaling between integrated circuit modules. An illustrative multi-module integrated circuit comprises: a transmitter in a first module, the transmitter providing a modulated carrier signal; a receiver in a second module demodulating the modulated carrier signal; and a galvanically isolated signaling path that includes: a first integrated resonator in the first module and a second integrated resonator in the second module, the first and second integrated resonators being resonantly coupled to convey the modulated carrier signal from the transmitter to the receiver. An illustrative embodiment of a method for providing an integrated circuit with a connection terminal for galvanically isolated signaling comprises: equipping the integrated circuit with a transmitter or receiver of a modulated carrier signal; connecting a transfer conductor to the connection terminal; and resonantly coupling the transmitter or receiver to a transfer conductor to convey the modulated carrier signal between the transfer conductor and the transmitter or receiver.

8 Claims, 3 Drawing Sheets

(51) Int. Cl.
*H01L 23/64* (2006.01)
*H01L 23/00* (2006.01)
*H01L 23/66* (2006.01)
*H01L 23/522* (2006.01)

(52) U.S. Cl.
CPC .............. H01L 24/09 (2013.01); H01L 24/49 (2013.01); *H01L 2924/1421* (2013.01)

(56) References Cited

U.S. PATENT DOCUMENTS

| | | | |
|---|---|---|---|
| 5,877,667 A | 3/1999 | Wollesen | |
| 6,124,756 A * | 9/2000 | Yaklin | H03K 19/01759 326/30 |
| 8,064,872 B2 | 11/2011 | Dupuis | |
| 2005/0269657 A1* | 12/2005 | Dupuis | H01F 19/08 257/446 |
| 2013/0265132 A1 | 10/2013 | Huang et al. | |

OTHER PUBLICATIONS

Shuichi Nagai et al., "A DC-Isolated Gate Drive IC With Drive-by-Microwave Technology for Power Switching Devices," 2012 IEEE International Solid-State Circuits Conference—ISSCC 2012 / Session 23 / Advances in Heterogeneous Integration / 23.3, pp. 404-406.

Swaminathan Sankaran et al., "An Efficient and Resilient Ultra-High Speed Galvanic Data Isolator Leveraging Broad-Band Multi Resonant Tank Electro-Magnetic Coupling," 2015 Symposium on VLSI Circuits Digest of Technical Papers, pp. C210-C211.

\* cited by examiner

RESONANCE-COUPLED SIGNALING BETWEEN IC MODULES

CROSS-REFERENCE TO RELATED APPLICATIONS

The present application relates to U.S. application Ser. No. 15/296,660 titled "Receiver for Resonance-Coupled Signaling" by inventors Karel Ptacek and Richard Burton, and filed concurrently herewith.

BACKGROUND

Integrated circuit designers often segregate device components into different modules. Such modularization can reduce fabrication costs and improve system performance. For example, a power converter may include power MOSFETs and other components designed for higher voltages and current loads, as well as small feature-size CMOS logic gates designed for fast control operations with minimal quiescent currents. An integrated circuit designer may choose to segregate the logic components from the power components to prevent the power components from damaging or interfering with the operations of the logic components. If such modules are placed on separate substrates, the manufacturing process applied to each substrate can be tailored for the types of components in each module, thereby minimizing the areal and cost requirements associated with each module while optimizing performance.

During the packaging process, the modules are interconnected as needed to form the desired integrated circuit device. In many cases, it is desirable for these inter-module connections to provide galvanic isolation. Existing techniques such as capacitors, transformers, magnetoresistive couplers, and optoisolators, are each believed to offer insufficient reliability, excessive propagation delay, excessive bulk, and/or excessive attenuation.

SUMMARY

Accordingly, there are disclosed herein various resonance-coupled configurations and methods employing coupled resonators for galvanically isolated signaling between integrated circuit modules. In one illustrative integrated circuit embodiment configured for galvanically isolated signaling via a connection terminal, the integrated circuit comprises: a transfer conductor connected to the connection terminal; a transmitter or receiver of a modulated carrier signal; and an integrated resonator resonant at a carrier signal frequency, the integrated resonator being laterally adjacent to, and electromagnetically coupled with, the transfer conductor to convey the modulated carrier signal between the transfer conductor and the transmitter or receiver. As used herein, the phrase "electromagnetically coupled" is intended to cover all forms of influence exerted by the electrical charges in one conductor on the charges in a second conductor insulated from the first, including inductive forces from magnetic flux coupling, capacitive forces from electric field coupling, and signal transfer from wave field coupling.

An illustrative multi-module integrated circuit embodiment comprises: a transmitter in the first module, the transmitter configured to provide a modulated carrier signal; a receiver in the second module configured to demodulate the modulated carrier signal; and a galvanically isolated signaling path that includes: a first integrated resonator in the first module and a second integrated resonator in the second module, the first and second integrated resonators being resonantly coupled to convey the modulated carrier signal from the transmitter to the receiver.

An illustrative embodiment of a method for providing an integrated circuit with a connection terminal for galvanically isolated signaling comprises: equipping the integrated circuit with a transmitter or receiver of a modulated carrier signal; connecting a transfer conductor to the connection terminal; and resonantly coupling the transmitter or receiver to a transfer conductor to convey the modulated carrier signal between the transfer conductor and the transmitter or receiver.

Each of the foregoing embodiments may be employed individually or in combination, together with any one or more of the following features in any suitable combination: (1) the integrated resonator comprises a parallel-coupled capacitance. (2) the integrated resonator comprises a series-coupled capacitance. (3) the integrated resonator is a floating loop electromagnetically coupled to the transmitter or receiver. (4) said connection terminal is a first connection terminal connected to a second connection terminal by the transfer conductor. (5) the first and second connection terminals are configured for electrically connecting to a remote pair of connection terminals which in turn are electrically connected to form a floating transfer loop. (6) each of said first and second connection terminals comprises a bonding pad on a first substrate. (7) the remote pair of connection terminals comprises a pair of bonding pads on a second substrate. (8) the transmitter is configured to receive a digital signal and to produce pulses in the modulated carrier signal with a first pulse width for rising edges in the digital signal and a second different pulse width for falling edges in the digital signal. (9) the galvanically isolated signaling path includes a transfer conductor with segments laterally adjacent to, and electromagnetically coupled with, each of the first and second integrated resonators. (10) the transfer conductor forms a floating transfer loop. (11) the first and second modules are on different integrated circuit substrates. (12) the first and second modules are on a shared integrated circuit substrate. (13) the first integrated resonator is a floating loop electromagnetically coupled to the transmitter and the second integrated resonator is a floating loop electromagnetically coupled to the receiver. (14) at least one additional transfer loop coupling the modulated carrier signal from the second integrated resonator to the receiver. (15) said resonantly coupling includes providing a floating resonator laterally adjacent to, and electromagnetically coupled with, the transfer conductor and electromagnetically coupled to the transmitter or receiver. (16) the floating resonator has a resonant frequency about equal to a carrier frequency of the modulated carrier signal. (17) forming a floating transfer loop by electrically connecting the first and second connection terminals to a remote pair of connection terminals which in turn are electrically connected by a remote transfer conductor.

It should be understood that the drawings and corresponding detailed description do not limit the disclosure, but on the contrary, they provide the foundation for understanding all modifications, equivalents, and alternatives falling within the scope of the appended claims.

DETAILED DESCRIPTION

Figure 1A:
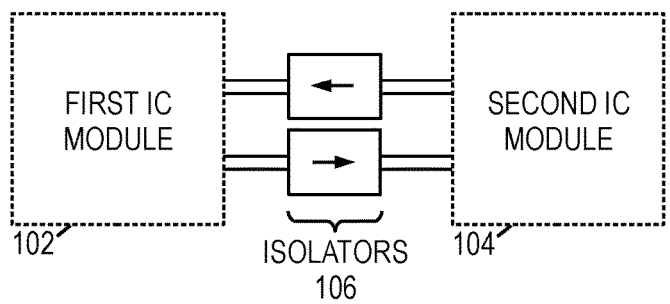
FIG. 1A is a block diagram of a first illustrative multi-module integrated circuit.

The galvanically isolated signaling techniques and systems disclosed herein are best understood in context. Accordingly, FIG. 1A shows a first illustrative multi-module integrated circuit having a first module 102 and a second module 104 interconnected with multiple galvanically isolated signaling paths. Such signaling paths may be desired where at least one of the modules is to be protected from high voltages, high currents, faults, and/or noisy signals in the other module. Each galvanically isolated signaling path includes one or more galvanic isolators 106. The galvanic isolators 106 are generally configured for unidirectional operation, with one port designated for input and the other port designated for output, but bidirectional configurations are also contemplated herein.

Each input and output port of the galvanic isolators 106 is preferably coupled to a module by a pair of conductors for differential signaling, though in some contemplated embodiments a ground connection may serve as one of the input or output conductors to provide single-ended signaling on that port. If both modules 102, 104 share a common ground connection, both the input and output ports may have one conductor coupled to that ground to achieve single-ended signaling on both ports. It should be evident to those skilled in the art where these variations can be applied in the ensuing examples.

Figure 1B:
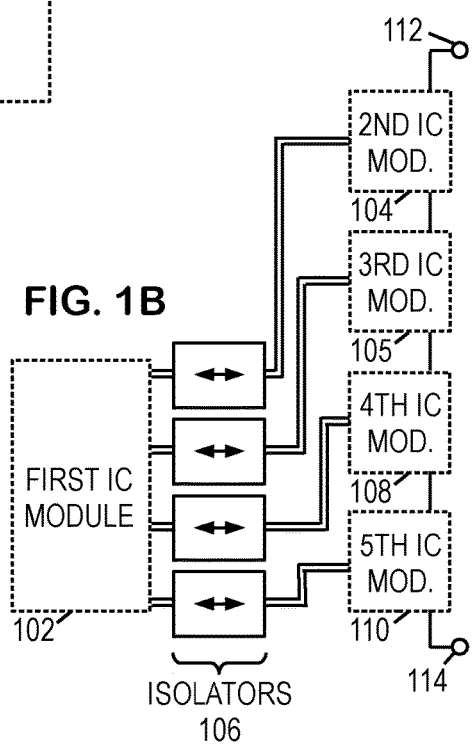
FIG. 1B is a block diagram of a second illustrative multi-module integrated circuit.

FIG. 1B shows a second illustrative multi-module integrated circuit, with the first module 102 coupled to each of four modules 104, 105, 108, and 110, which are arranged in series between terminals 112 and 114. The supply voltages of the four modules 104-110 are suitably laddered to conform to their individual module ratings even as they cooperate to control a significantly larger voltage than what they are rated for individually. The galvanic isolators 106 enable the first module 102 to coordinate the operations of the four modules 104-110 despite their varying supply voltages.

Figure 1C:
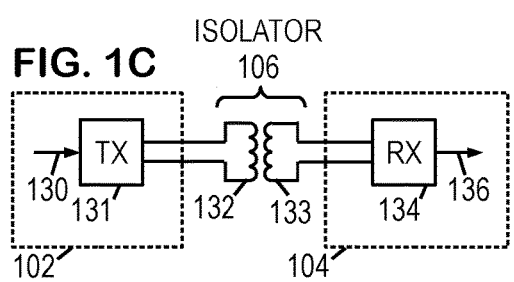
FIG. 1C is a schematic of a transformer-based galvanic isolator.

FIG. 1C shows a transformer-based implementation of a galvanic isolator 106. Module 102 includes a transmitter 131 that converts a digital signal 130 into a modulated carrier signal for driving the transformer's primary coil 132. The transformer's secondary coil 133 is electromagnetically coupled to the primary coil 132, enabling the modulated carrier signal to traverse the gap between the coils, albeit while exhibiting some attenuation. At suitable carrier frequencies, the coils 132, 133 can be replaced with parallel conductors that couple electromagnetically, enabling the modulated carrier signal to traverse the intervening gap in much the same way as with adjacent transformer coils.

A receiver 134 in module 104 receives the modulated carrier signal and demodulates it to obtain a digital receive signal 136. Though FIG. 1C shows unidirectional operation, a time multiplexing arrangement of transceivers in each module could be used to provide bidirectional communications.

Figure 1D:
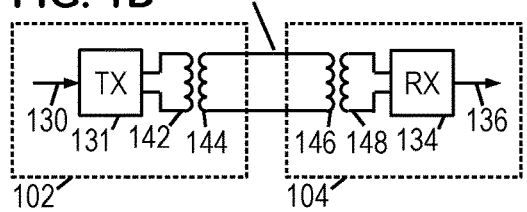
FIG. 1D is a schematic of an integrated transformer-based signal path.

An external transformer such as that shown in FIG. 1C may be excessively bulky and/or may undesirably require additional steps during the assembly and packing process. Accordingly, FIG. 1D shows an implementation that employs multiple transformers integrated within the modules 102, 104. Transmitter 131 supplies the modulated carrier signal to the primary 142 of an integrated transformer within the first module 102. The transformer secondary 144 transfers the modulated carrier signal to the primary 146 of an integrated transformer within the second module 104. The transformer secondary 148 conveys the modulated carrier signal to the receiver 134.

The use of multiple galvanic isolators on the signal path (e.g., the two transformers) enables any voltage drop between the modules to be divided across the multiple transformer gaps, reducing the voltage drop across each and enabling the voltage of the floating transfer loop to migrate (via charge leakage) to an intermediate value. These properties may be advantageous for the reduced feature sizes typical of integrated transformers, but a greater attenuation may be expected due to the signal's traversal of multiple gaps.

Figure 2A:
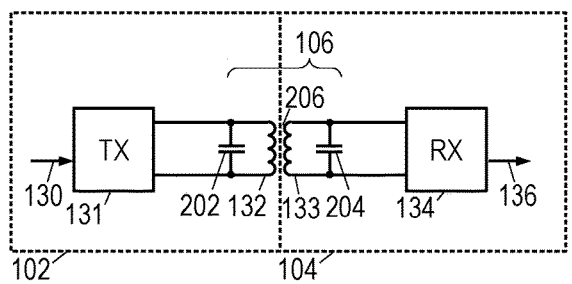
FIG. 2A is a schematic of an illustrative signal path employing coupled parallel resonators.
Figure 2B:
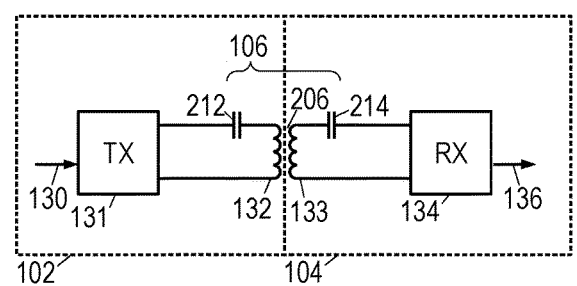
FIG. 2B is a schematic of an illustrative signal path employing coupled serial resonators.

To provide enhanced galvanic isolation with reduced attenuation and minimal complexity, the present disclosure provides for the use of coupled resonators, shown in their most basic form in FIGS. 2A-2B. Here, modules 102, 104 are shown as being adjacent, suggesting these basic forms are most suitable for modules that share the same integrated circuit substrate, for reasons that are discussed further below.

FIG. 2A shares some resemblance to the implementation of FIG. 1C, with the notable differences that galvanic isolator 106 takes the form of an integrated transformer, and the transformer's primary 132 and secondary 133 are each equipped with one of the parallel capacitances 202, 204. The value of capacitance 202 is chosen based on, or jointly with, the self-inductance of primary 132 to provide a resonator in the first module 102 with a resonance frequency that matches the frequency of the carrier signal modulated by transmitter 131. That is, if the carrier frequency is $f_c$ and the self-inductance of primary 132 is $L_p$, the capacitance 202 would be set to:

$$C_p = ((2\pi f_c)^2 L_p)^{-1}$$

Similarly, the value of capacitance 204 is chosen based on, or jointly with, the self inductance of secondary 133 to provide a resonator in the second module 104 with the same resonance frequency. These resonators are electromagnetically coupled via the transformer gap 206.

FIG. 2B shows an alternative to the parallel resonator configuration of FIG. 2A, i.e., a series resonator configuration having a capacitance 212 in series with transformer primary 132 and a capacitance 214 in series with transformer secondary 133. As before, the resonators are electromagnetically coupled via the transformer gap 206. Yet another alternative is to have the coupled resonators include a parallel resonator configuration and a series resonator configuration. The chief distinction between the series and parallel resonator configurations is their driving impedance, but the quality factors of the different configurations can also be a significant consideration.

For the parallel configuration, the driving impedance reaches a maximum at the resonance frequency, whereas at the resonance frequency the driving impedance reaches a minimum for the series configuration. For the series configuration, the quality factor increases as the square root of L/C. For the parallel configuration, the quality factor (at least ideally) increases as the square root of C/L. However, parasitic resistance should be considered for a proper determination of quality factor Q.

The use of coupled resonators enhances the electromagnetic coupling across the gap 206, reducing the attenuation experienced by the signal as it traverses the gap. The resonators further act as bandpass filters, passing the modulated carrier signal but strongly attenuating extraneous noise and out-of-band signals. Higher quality factors provide better filtering and more enhanced coupling, but these considerations may have to be balanced against the larger propagation delays. Resistive components may be introduced as needed to reduce the quality factors. While it may be preferred for some embodiments to employ quality factors Q in excess of 10, quality factors in the range between 1 and 10, inclusive may be suitable for most galvanically isolated signaling applications.

Figure 3A:
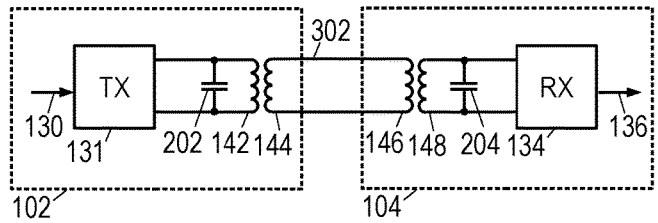
FIG. 3A is a schematic of an illustrative resonantly-coupled signal path with a transfer loop.

FIG. 3A shares some resemblance to the implementation of FIG. 1D, with the notable difference that in the first module 102, transformer primary 142 is provided with a parallel capacitance 202 to form a first resonator, and in the second module 104, transformer secondary 148 is provided with parallel capacitance 204 to form a second resonator electromagnetically coupled to the first resonator via an intermediate transfer loop 302. Unlike the implementation of FIG. 1D, the use of matched resonators provides enhanced coupling, even though that coupling is mediated by the transfer loop 302. The resonant coupling enables the transfer loop to accommodate substantial variation in the electrical characteristics of bonding pads, bond wires, solder balls, etc., which naturally arise from manufacturing imperfections. Thus, the embodiment of FIG. 3A is not just suitable for interconnecting modules on a shared substrate, but also for interconnecting modules on separate substrates.

Figure 3B:
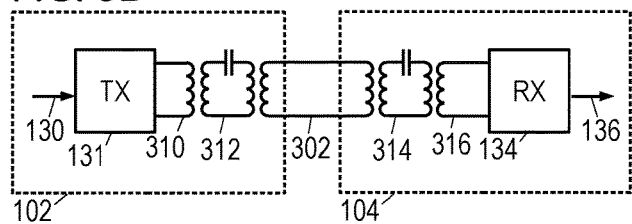
FIG. 3B is a schematic of an illustrative signal path with resonator loops.

FIG. 3B shows an illustrative galvanically isolated signal path that includes two floating resonator loops 312, 314. In the first module 102, transmitter 131 drives transformer primary 310 with the modulated carrier signal. Resonator loop 312 electromagnetically couples with the primary 310 to accept and convey the modulated carrier signal to the transfer loop 302. In the second module 104, resonator loop 314 electromagnetically couples with the transfer loop 302 to accept and convey the modulated carrier signal to transformer secondary 316, which in turn communicates the modulated carrier signal to the receiver 134. The floating loop resonators 312, 314 are matched (i.e., they have the same resonance frequency) to provide resonant coupling mediated by the transfer loop 302. The floating loop design is expected to provide better manufacturing control of the resonance frequency for these resonators. Moreover, the number of electromagnetic coupling gaps is increased to four, further distributing any voltage between the ends of the signal path.

Figure 4:
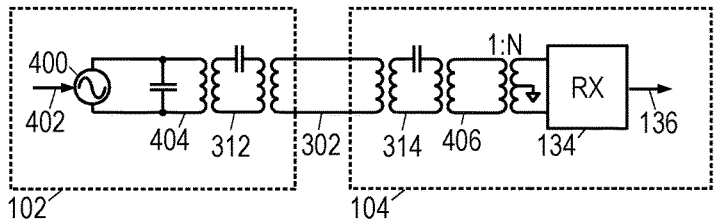
FIG. 4 is a schematic of an illustrative resonantly-coupled signal path with multiple transfer loops.

FIG. 4 shows an illustrative galvanically isolated signal path having multiple transfer loops. In this embodiment, transmitter 131 takes the form of an oscillator 400 whose operation is enabled and disabled by a pulse-width modulated signal 402. When enabled, the oscillator 400 produces a carrier signal oscillating at a carrier frequency that is stabilized by a stabilization resonator 404. The carrier frequency is an adjustable design parameter with higher frequencies offering reduced space requirements and reduced propagation delays together with higher attenuation and higher current demands. In at least some contemplated embodiments, the carrier frequency is in the range of 2-3 GHz. Given the currently available technology, the disclosed principles are expected to be feasible for any carrier frequency in the range from about 100 MHz to whatever the fastest switches will support, e.g., about 100 GHz.

The pulse width modulated signal 402 is derived from digital signal 130 and in at least some contemplated embodiments represents the rising edges of the digital signal 130 with a first pulse width (e.g., 10 to 20 ns) and the falling edges with a second, different pulse width (e.g., 4 to 8 ns). The resulting modulated carrier signal produced by the oscillator 400 is thus able to convey the digital signal's polarity information across the galvanically isolated signaling path.

The floating resonator loop 312 couples with the stabilization resonator 404 to accept and convey the modulated carrier signal to the transfer loop 302. In the second module 104, the transfer loop 302 couples with another floating loop resonator 314 to convey the modulated carrier signal between the two modules 102, 104. Floating loop resonator 314 in turn electromagnetically couples to a second transfer loop 406 to convey the modulated carrier signal. Transfer loop 406 includes the primary of a step-up transformer to amplify the modulated carrier signal. The secondary of the illustrated transformer is center-tapped to ground to convert the modulated carrier signal into differential inputs for the receiver 134 while also suppressing any common mode signal. In at least one contemplated embodiment, the winding ratio of the step-up transformer is 1:8, though other winding ratios may be employed.

Figure 5:
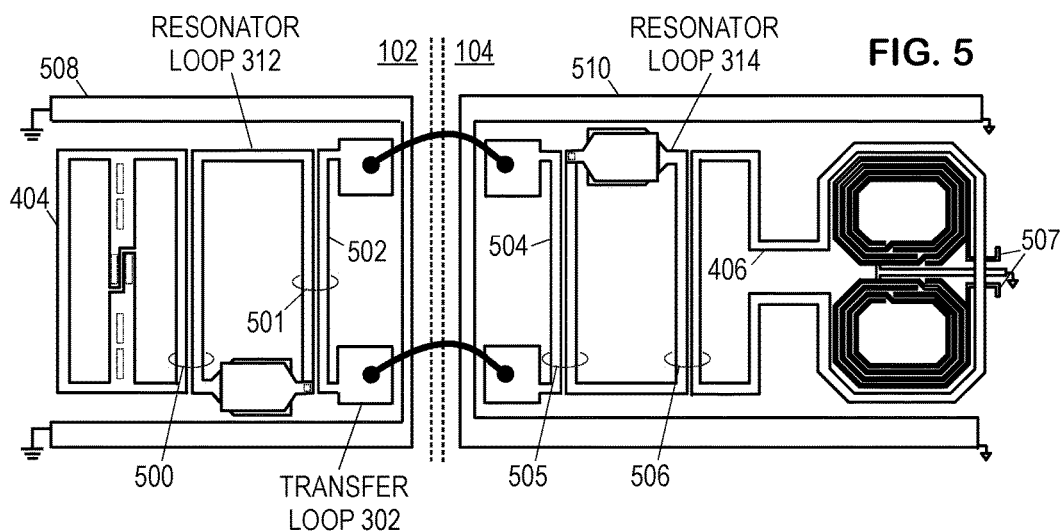
FIG. 5 is a layout diagram of an illustrative resonantly-coupled signal path.

FIG. 5 shows an illustrative layout for the galvanically isolated signal path of FIG. 4. Though not drawn precisely to scale, the layout nevertheless demonstrates principles of providing resonant coupling mediated by transfer loops. FIG. 5 shows the relevant elements of the metallization layers formed on the integrated circuit substrate, and omits the transistors coupled to the oscillator terminals and the receiver terminals.

The center terminals of the stabilization resonator 404 are coupled to an integrated PN junction that provides the capacitive component of the resonator. The arms coupling the center terminals to the surrounding inductive element are also coupled to integrated transistors for supplying a modulated carrier signal to the stabilization resonator 404.

In the first module 102, a pair of conductor segments 500 are arranged in close parallel to provide electromagnetic coupling between the stabilization resonator 404 and the floating loop resonator 312. As both conductor segments can be included with the same metallization layer, this laterally-adjacent coupling configuration provides high a coupling coefficient with minimal manufacturing complexity. A second pair of conductor segments 501 are similarly arranged in close proximity to electromagnetically couple the floating loop resonator 312 to a transfer conductor 502 that connects two connection terminals, shown here in the form of two bonding pads. Two bond wires electrically connect the connection terminals of module 102 to two remote connection terminals of module 104. A transfer conductor 504 electrically connects together the two remote connection terminals (also shown in the form of bonding pads) to complete the transfer loop 302. A third pair of laterally-adjacent conductor segments 505 electromagnetically couples the transfer conductor 504 to the floating loop resonator 314. A fourth pair of laterally-adjacent conductor segments 506 electromagnetically couples the floating loop resonator 314 to transfer loop 406, which includes the primary for the step-up transformer. The transformer secondaries (of which only one layer is shown in FIG. 5) are coupled between the receiver terminals 507.

FIG. 5 further shows a guard ring 508 for the signal path components of the first module 102, and another guard ring 510 for the signal path components of the second module 104, each coupled to their module's ground or some other useful reference voltage. The guard rings 508, 510 operate to shield nearby components of the modules 102, 104 from electromagnetic interference that might otherwise be generated by the high-frequency signals carried by the signal path components.

In the embodiment of FIG. 5, the conductor segments 500, 501, 505, 506 (and any intermediate conductor segments) are expected to provide sufficient inductance and electromagnetic coupling to enable the operation of the galvanically isolated signal path. Capacitance for the resonator loops 312, 314, is shown being implemented as metal-insulator-metal (MIM) plate capacitors. Various suitable alternatives exist and are also contemplated herein. For example, the inductors may be implemented as discrete elements, e.g., coils or spiral inductors. As another example, a hybrid element such as an interdigitated capacitor may provide both inductive and capacitive properties in a single element. The radiofrequency (RF) circuit design literature includes many other resonant structures and electromagnetic coupling strategies suitable for integration into the disclosed systems. In addition to the transformer-based and antenna/transmission-line based coupling strategies of FIG. 5, a capacitive electrode-based coupling strategy could be employed. Matched resonators can be employed to enhance the performance for each of these strategies.

Figure 6:
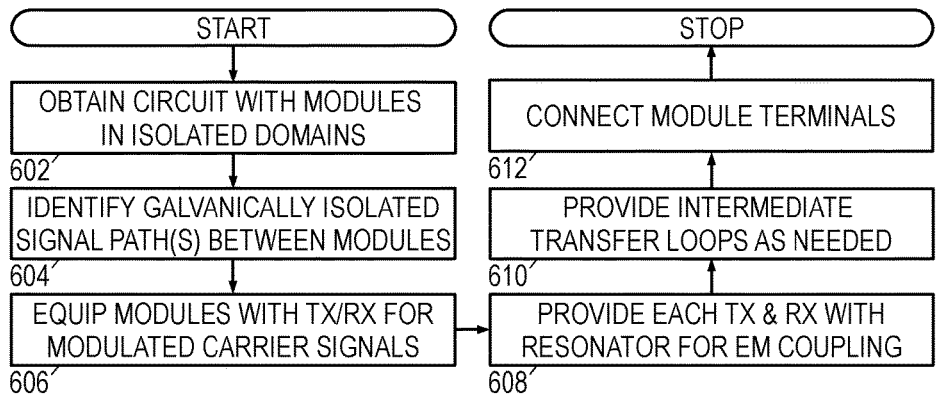
FIG. 6 is a flow diagram of an illustrative method for resonantly-coupled signaling.

FIG. 6 is a flow diagram of an illustrative method for resonantly-coupled signaling. The method begins in block 602 with an integrated device manufacturer obtaining a circuit having modules in isolated domains. Examples of these were discussed with respect to FIGS. 1A-1B. In block 604, the manufacturer identifies the one or more inter-module signaling paths that are to be equipped with galvanic isolation. In block 606, each such signaling path is provided with at least one associated transmitter and at least one associated receiver configured to transmit or receive a modulated carrier signal. Time multiplexing may be used to enable a given signaling path to carry multiple signals in one or both directions. In block 608, the manufacturer provides each module with at least one resonator. The resonators are matched to a shared resonance frequency to enable resonant coupling. In block 610, transfer loops are optionally added to provide electromagnetic coupling between the resonators and their associated transmitters or receivers. Transfer conductor segments (incomplete transfer loops) may also be provided to support electromagnetic coupling between the resonators in different modules. In block 612, any such incomplete transfer loops are closed by electrically connecting terminals of such transfer conductor segments.

It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) are reasonable variances from the ideal goal of exactly as described.

The terms first, second, third and the like in the claims or/and in the Detailed Description, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, while some embodiments described herein include some but not other features included in other embodiments, combinations of features of different embodiments are meant to be within the scope of the invention, and form different embodiments, as would be understood by those skilled in the art. Inventive aspects may lie in less than all features of a single foregoing disclosed embodiment.

These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. An integrated circuit configured for galvanically isolated signaling via a connection terminal, the integrated circuit comprising:
   a transfer conductor connected to the connection terminal;
   a transmitter or receiver of a modulated carrier signal; and
   an integrated resonator resonant at a carrier signal frequency, the integrated resonator being laterally adjacent to, and electromagnetically coupled with, the transfer conductor to convey the modulated carrier signal between the transfer conductor and the transmitter or receiver,
   wherein said connection terminal is a first connection terminal connected to a second connection terminal by the transfer conductor, the first and second connection terminals being configured for electrically connecting to a remote pair of connection terminals which in turn are electrically connected to form a floating transfer loop,
   wherein the transmitter or receiver comprises a transmitter configured to receive a digital signal and to produce pulses in the modulated carrier signal with a first pulse width for rising edges in the digital signal and a second different pulse width for falling edges in the digital signal.

2. The integrated circuit of claim 1, wherein the integrated resonator comprises a parallel-coupled capacitance.

3. The integrated circuit of claim 1, wherein the integrated resonator comprises a series-coupled capacitance.

4. The integrated circuit of claim 1, wherein each of said first and second connection terminals comprises a bonding pad on a first substrate, and wherein said remote pair of connection terminals comprises a pair of bonding pads on a second substrate.

5. The integrated circuit of claim 3, wherein the integrated resonator is a floating loop electromagnetically coupled to the transmitter or receiver.

6. A method of providing an integrated circuit with a connection terminal for galvanically isolated signaling, the method comprising:
- equipping the integrated circuit with a transmitter or receiver of a modulated carrier signal;
- connecting a transfer conductor to the connection terminal;
- providing a floating loop integrated resonator laterally adjacent to, and electromagnetically coupled with each of the transfer conductor and the transmitter or receiver, to convey the modulated carrier signal between the transfer conductor and the transmitter or receiver; and
- configuring the transmitter to receive a digital signal and to produce pulses in the modulated carrier signal with a first pulse width for rising edges in the digital signal and a second different pulse width for falling edges in the digital signal,
- wherein said connection terminal is a first connection terminal, and wherein said connecting includes connecting the first connection terminal to a second connection terminal by the transfer conductor, and wherein the method further comprises: forming a floating transfer loop by electrically connecting the first and second connection terminals to a remote pair of connection terminals which in turn are electrically connected by a remote transfer conductor.

7. The method of claim 6, wherein the floating resonator has a resonant frequency approximately equal to a carrier frequency of the modulated carrier signal.

8. The method of claim 6, wherein each of said first and second connection terminals comprises a bonding pad on a first substrate, and wherein said remote pair of connection terminals comprises a pair of bonding pads on a second substrate.

* * * * *